United States Patent [19]

Womack

[11] Patent Number: 4,458,294
[45] Date of Patent: Jul. 3, 1984

[54] COMPLIANT TERMINATION FOR CERAMIC CHIP CAPACITORS

[75] Inventor: Billy B. Womack, Wendell, N.C.

[73] Assignee: Corning Glass Works, Corning, N.Y.

[21] Appl. No.: 402,553

[22] Filed: Jul. 28, 1982

[51] Int. Cl.³ .......................... H01G 1/14; H01C 7/00
[52] U.S. Cl. .................................... 361/321; 338/309
[58] Field of Search ..................... 361/321, 324, 306; 29/25.42; 338/195, 309

[56] References Cited

U.S. PATENT DOCUMENTS

| | | | |
|---|---|---|---|
| 1,952,925 | 3/1934 | Kopinski | 361/324 X |
| 3,612,963 | 10/1971 | Piper | 29/25.42 X |
| 3,621,442 | 11/1971 | Racht et al. | 338/309 |
| 3,679,950 | 7/1972 | Rutt | 361/321 |
| 3,710,210 | 1/1973 | Heron | 361/321 X |
| 3,914,666 | 3/1974 | Schmickl et al. | 361/321 |
| 4,030,004 | 6/1977 | Rutt | 361/313 |
| 4,297,773 | 11/1981 | Galvagni | 29/25.42 |

FOREIGN PATENT DOCUMENTS 1004476 9/1965 United Kingdom ................ 361/306

Primary Examiner—Donald A. Griffin
Attorney, Agent, or Firm—W. J. Simmons, Jr.

[57] ABSTRACT

A monolithic capacitor chip having improved conductive terminations. The capacitor comprises a conventional body formed of stacked, alternately arranged layers of dielectric material and metallic electrode material, alternate electrodes extending to opposite endfaces of the body, and a noncompliant metalized layer on each of the opposite endfaces electrically contacting the electrodes extending thereto. In accordance with this invention each of the noncompliant metalized layers is provided with a compliant coating of an alloy preferably comprising more than 90% lead. A metallic layer is disposed over the surface of each of the compliant coatings, the melting point of the metallic layers being greater than that of the compliant coating. The metallic layer preferably consists of a layer of copper or nickel plating, the surface of which is plated with an oxidation resistant metal such as tin, gold, or the like.

9 Claims, 12 Drawing Figures

COMPLIANT TERMINATION FOR CERAMIC CHIP CAPACITORS

BACKGROUND OF THE INVENTION

The present invention relates to monolithic chip capacitors, especially chip capacitors adapted to be connected directly to circuit boards as opposed to capacitors having flexible leads extending therefrom.

Increasing use is being made of chip capacitors because of their compactness and inherent reliability. Such capacitors are conventionally provided with two or more termination portions at their end edges and are mounted directly to conductive lands on the surface of a substrate formed of alumina, epoxy-filled fiber glass or the like. The terminations are placed in direct contact with the lands and are mechanically and electrically connected thereto by solder or a conductive epoxy bonding material.

During the fabrication of electronic circuits on the printed circuit board and/or during the use of such circuit, temperature cycling is encountered. Because of the mismatch in thermal expansion coefficients between the materials of the capacitor chip and the substrate or printed circuit board on which the chip is mounted, fracturing can occur in the chip body or at the interface between the termination and the capacitor electrodes.

To avoid such failure of discrete monolithic capacitors, attempts have been made to introduce a compliant connection at the interface between the capacitor termination and the circuit board such that the differential shrinkage and expansion of the components will not exert excessive stresses on the fragile elements of the device but rather, will be absorbed by flexure of the compliant connection. One such compliant member comprises a tab which, like the lead wire on a conventional capacitor, absorbs the stress introduced by differential expansion of components. Such a tab increases the cost of the capacitor chip by virtue of the presence of an additional part, together with the operations necessary to apply that part to the chip.

Another solution to the problem of capacitor chip failure is to form the chip in such a manner that the chip terminations are connected to the substrate by columns of solder, the dimensions of which render the solder connections compliant. A capacitor chip of this type is disclosed in U.S. Pat. No. 4,297,773. The capacitor chip is provided with support means such as a platform or a plurality of ridges which space the conductive terminations from the conductive lands on the substrate when the chip is positioned on the substrate. The distance between the substrate and the bottom of the capacitor chip in the region of the conductive terminations is said to be at least 5 mils to insure that a substantial expanse or vertical column of solder will exist between the conductive terminations of the capacitor and the substrate lands. There is thus provided a solder connection of sufficient length to provide a relatively high compliance connection between the capacitor and the conductive lands of the substrate thereby causing mechanically generated stress to be absorbed or compensated within the solder body rather than being transmitted to the capacitor at sufficiently high levels to cause capacitor failure or change in value. Because of the shape of that type of capacitor, special equipment is required for its manufacture. Also, special equipment is required for the placement of such capacitors on substrates since only one side of the capacitor can face the substrate.

SUMMARY OF THE INVENTION

An object of the present invention is to provide a monolithic chip capacitor which, when mounted on a printed circuit substrate, is able to withstand stress induced by thermal expansion mismatch between the dielectric capacitor body and the substrate.

The capacitor chip of the present invention comprises a multi-layer dielectric capacitor body formed of stacked, alternately arranged layers of dielectric material and metallic electrode material, alternate electrode layers extending to opposite ends of the body. Each of the opposite endfaces is provided with a noncompliant metalized coating which electrically connects the electrode layers extending to that endface. Each of the noncompliant metalized layers is provided with a coating of compliant conductive material, and a metallic layer is disposed over the surface of each of the compliant coatings, the melting point of the metallic layer being greater than that of the compliant coatings.

DESCRIPTION OF THE PREFERRED EMBODIMENTS

Figure 1:
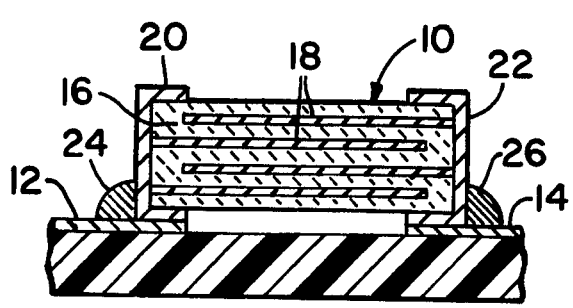
FIG. 1 shows a prior art capacitor chip mounted on a circuit substrate.

In FIG. 1 a prior art monolithic capacitor chip 10 is shown mounted on a circuit substrate having conductive lands 12 and 14 thereon. Capacitor 10 comprises body 16 of ceramic, glass or glass-ceramic in which electrode layers 18 are interleaved. Alternate ones of the electrodes 18 extend to opposite ends of the chip where metallic coatings 20 and 22 are applied to connect each set of electrode layers in parallel and to provide termination means. End terminations 20 and 22 are often formed by firing a mixture of glass frit and particles of a metal such as silver or by sputtering a base metal onto the ends of the chip. These conventional terminations, which are noncompliant, are in direct contact with lands 12 and 14 and are permanently affixed thereto. Thus, any differential expansion between the capacitor chip and the substrate can cause failure of the capacitor as described hereinabove.

Figure 2:
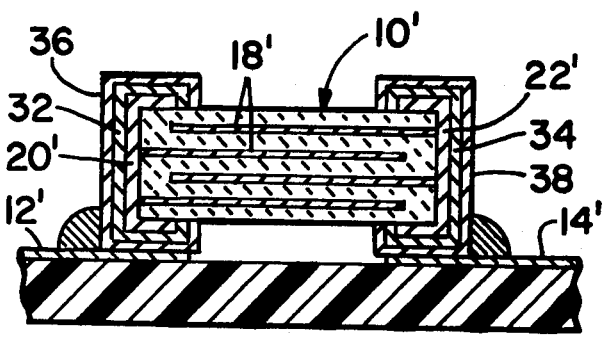
FIG. 2 shows the capacitor chip of the present invention mounted on a substrate.

In accordance with the present invention there is provided a compliant connection between the end terminations of the capacitor chip and the conductive substrate lands. This improved capacitor chip end termination is illustrated in FIG. 2 wherein elements similar to those of FIG. 1 are represented by primed reference numerals. Conductive end terminations 20' and 22' may be any conductive material known in the art for connecting sets of electrodes 18' in parallel. The outer surfaces of end terminations 20' and 22' are coated with a lead alloy 32, 34 which provides the compliant connection between the capacitor chip and the substrate. To provide a maximum amount of compliance, coatings 32 and 34 should contain at least 50% lead; a preferred compliant coating contains more than 90% lead and small amounts of silver and tin. The higher lead content coatings are preferred since they have higher melting temperatures and are more malable. Alloys having high melting temperatures do not soften or flow during soldering of a chip to a substrate. It is thought that the thickness of compliant coatings 32 and 34 should be from about 2.5 to 5 μm or more to possess the necessary compliant characteristics.

The outer surfaces of compliant coatings 32 and 34 are plated with layers 36 and 38 of conductive material which retain a minimum thickness of the compliant lead alloy between the chip end terminations 20' and 22' and the substrate lands 12' and 14' when the chips are soldered thereto. If the plated layers 36 and 38 were not present during the soldering operation, constituents of the molten solder could diffuse into the compliant layer 20 and change the characteristics thereof. Thus, the thickness of the unaltered portion of the lead alloy could become smaller than that necessary to provide a suitable compliant connection. Layers 36 and 38 may consist of nickel, copper, gold, silver, palladium or the like, or alloys thereof, and such layers are preferably applied by electroplating. If these layers are formed of an easily oxidized metal such as nickel or copper, they should be coated with an oxidation-resistant metal such as tin, tin alloy, gold, silver, palladium or the like. Layers 36 and 38 must have a melting point higher than that of compliant coatings 32 and 34, the melting point of these layers preferably being greater than 900° C. If coatings 32 and 34 were plated with tin, for example, the tin plating would melt and alloy with coatings 32 and 34 during soldering, thereby reducing the effective thickness of the compliant coatings. The lead alloy that is sandwiched between the chip end metallizations and the plated end caps 36 and 38 acts as a compliant buffer that absorbs stresses which would otherwise be imparted to the chip or the end metallization during temperature cycling.

Figure 3:
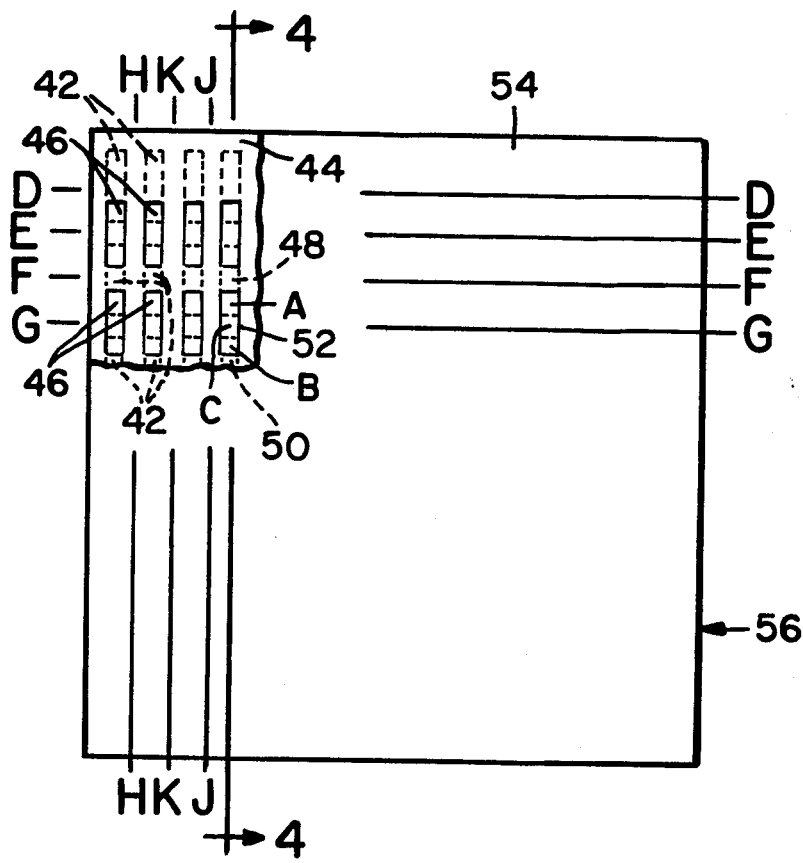
FIG. 3 is a fragmentary plan view illustrating a technique for forming a large number of capacitor chips.

FIGS. 3 through 7 illustrate a first method of forming monolithic capacitor chips having compliant end terminations. FIG. 3 illustrates a well known technique by which commercial quantities of chips can be formed. A plurality of sets of elongated films 42 is first applied to one green dielectric sheet in a suitably spaced and positioned manner. Thereafter a second green dielectric sheet 44 is disposed thereover in register with the green dielectric sheet to which films 42 were applied. A second plurality of elongated films 46 are then applied to green dielectric sheet 44 in such manner that a portion of each of films 46 will overlap a portion of at least one of said plurality of films 42. In particular, films 48 and 50, being two of the plurality of films 42, have been positioned such that film 52, one of the plurality of films 46, can be applied to sheet 44 so as to partly overlap both film 48 and film 50. This is illustrated by rectangles "A" and "B", "A" being the overlapping portion between films 48 and 52 and "B" being the overlapping portion between films 50 and 52. Rectangle "C" is that portion of film 52 which does not overlap any of the plurality of films 42.

Figure 4:
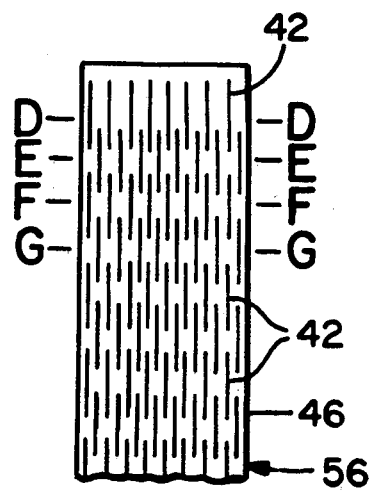
FIG. 4 is a cross-sectional side elevation of the capacitor stack of FIG. 3 taken along lines 4—4 thereof.
Figure 5:
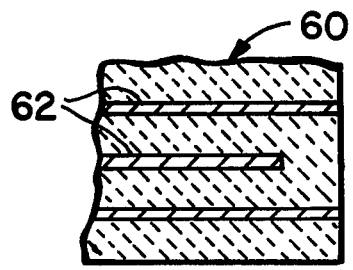
FIGS. 5 through 7 illustrate successive steps in a method of making the chip capacitor of the present invention.

A third green dielectric sheet 54 is then disposed over the plurality of films 46 to provide a cover therefor. As will be readily understood, the plurality of capacitor units formed in accordance with the illustration of FIG. 3 may each contain a plurality of electrodes as illustrated in FIG. 4. To obtain multiple pairs of electrodes, the process described in conjunction with FIG. 3 above is repeated as many times as is necessary to produce the proper electrical characteristics of the capacitor. Accordingly, a third plurality of conductive films would be applied to green dielectric sheet 54 in register with plurality of films 42 over which a fourth green dielectric sheet would be disposed. To such a fourth green sielectric sheet a fourth plurality of silms would be applied in register with plurality of films 46, and so on. Thereafter, capacitor stack 56 would be pressed and fired in a manner well known in the art.

After pressing and, if necessary, heat treating capacitor stack 56, the resultant dense monolithic structure can be severed by any suitable means known in the art such as a diamond saw or the like. The assembly can be cut along lines D, E, F, G, and so on in one direction and along lines H, K, J, and so on in the direction perpendicular to lines D, E, F, and G. It is seen that by cutting the assembly in this manner a plurality of capacitor units are obtained, each having an electrode overlapping a portion of a successive electrode while both electrodes have non-overlapping portions extending in opposite directions. In addition, the ends of the non-overlapping portions of the electrodes are automatically exposed during cutting while the sides thereof are not exposed and thus remain hermetically sealed within the mass of dielectric material. Of course, the cuts along lines H, K, and J must be narrower than the space between the electrodes to achieve hermetic sealing.

FIG. 4 shows capacitor stack 56 after pressing and heating, illustrating how capacitor strips are cut therefrom along lines D, E, F, and G, exposing only the ends of the capacitor electrodes.

Although glass and glass-ceramic materials have been employed as the dielectric sheet material, ceramic dielectric materials are generally employed. The ceramic formulations generally used consist of barium titanate as the major constituent with varying amounts of one or more alkaline earth oxides, titanates, zirconates, stannates, and minor additions of other metallic oxides.

The dielectric sheets are preferably formed as a flexible structure by a technique such as that taught in U.S. Pat. Nos. 3,604,082 (McBrayer et al.) and 3,659,990 (Cato et al.). The ceramic raw material is ground to a fine powder and then blended with suitable resins, solvents and plasticizers to make a castable mixture. This mixture is cast into the form of large thin sheets which are then dried and cut into sheets of desired size. As described above, the sheets can be stacked and printed, or alternatively, they can be provided with a pattern of electrode layers before they are stacked.

The electrode layers can be formed by screen printing or otherwise metallizing selected portions of the surface of the ceramic sheet with an electrode material in the form of a paste consisting of one or more noble metals mixed with suitable resins, binders and solvents. The electrode registration pattern is such that after the sheets are stacked and fired and the resultant block cut into chips 60 (see FIG. 5), alternate electrodes 62 will be exposed on different end faces. In the preferred embodiment, the body of the chip is rectangularly-shaped, and the electrodes extend to opposite end faces.

Figure 6:
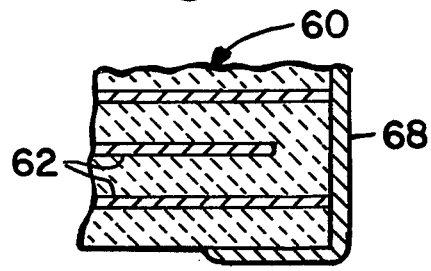

As shown in FIG. 6 a metallic coating 68 is then applied to each end of capacitor body 60 to connect each set of electrode layers in parallel and to provide termination means whereby the capacitor may be soldered to a circuit. This end metallization means 68 is generally a fired-on mixture of silver particles and a glass frit which bonds the silver particles to the ceramic body. Because end metallization coating 68 is noncompliant, any thermally induced change in substrate dimension would be transmitted to the capacitor body if end metallization 68 were soldered directly to a conductive substrate path. Thus, a layer 70 of lead alloy is applied to the surface of conductive layer 68 by any well known process such as a hot dipping technique. A thin conductive layer or film 72 is then plated on the outer surface of layer 70. Since it is preferred to employ an inexpensive metal such as nickel or copper for plated layer 72, that layer is plated with a layer 74 of an oxidation-resistant metal such as tin or tin alloy to form the chip capacitor shown in FIG. 7.

Figure 8:
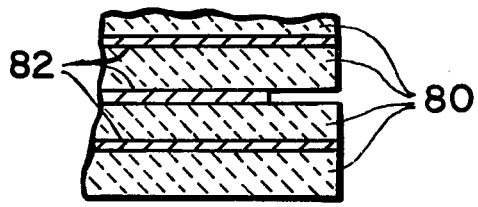
Figure 12:
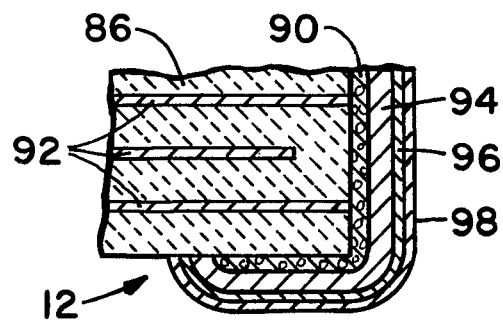

Another method of forming compliant end terminations on monolithic capacitor chips is shown in FIGS. 8 through 12. This method is based on a tehhnique in U.S. Pat. Nos. 3,679,950 and 4,030,004 (Rutt). As in the previously described method, there are provided thin sheets of dielectric material comprising particulate ceramic dielectric in an organic binder. Instead of applying thin films of noble metal to the dielectric sheets to form the capacitor electrodes, there is applied to each of the dielectric sheets a pattern of films of a material which, upon firing, forms a cavity or a region characterized by a high degree of connected porosity. A fragmentary cross-sectional view of a stack of dielectric sheets 80 is illustrated in FIG. 8, each sheet having been provided with a strata 82 which forms a highly porous region when fired. To form cavities of very high porosity a carbon electrode paste is screened onto those regions of the ceramic dielectric sheets which are to be later occupied by capacitor electrodes. In accordance with the teachings of U.S. Pat. No. 4,030,004, such a paste may comprise a mixture of ceramic particles, carbon black and a squeegee medium composed of 80 ml pine oil, 14 g acrylic resin and 1.5 g lecithin dispersing agent to which 1.3% (based on the total weight of all other ingredients of the composition) of ethyl cellulose is added to increase the viscosity. To form a less porous region, one of the compositions set forth in U.S. Pat. No. 3,679,950 may be employed. As an example of a composition for forming the less porous strata, that patent describes a ceramic composition consisting of 66.94% $BaCo_3$, 27.1% $TiO_2$, 3.32% $Bi_2O_3$ and 2.64% $ZrO_2$, all in powdered form, blended on a 1:1 weight basis with the aforementioned squeegee medium.

Figure 9:
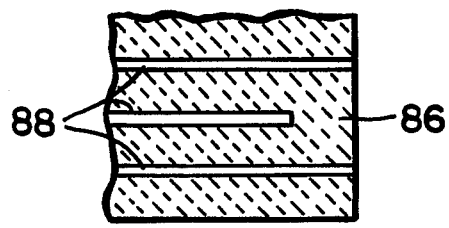
FIGS. 8 through 12 illustrate successive steps in an alternative capacitor manufacturing method.

After the strata 82 are applied to selected regions of dielectric sheets 80 by a technique such as screen printing, the dielectric sheets are stacked as shown in FIG. 8. The stacked sheets are pressed at an elevated temperature to form blocks. The blocks are then cut to form smaller blocks or chips. The coatings 82 are applied to the dielectric sheets in predetermined patterns so that each of the severed chips includes alternate strata of screen printed composition that are exposed on opposite ends but are not exposed on the sides of the chips. The chips are then heated to drive off and/or decompose the temporary binding material in the ceramic layers and are thereafter fired at a high temperature to form sintered chips. As shown in FIG. 9, each fired chip consists of a ceramic body 86 in which there are situated porous cavities 88.

Cavities 88 may be provided with conductive material in the manner disclosed in the aforementioned Rutt patents. For example, the chips of FIG. 9 may be immersed in silver nitrate in a vessel in which the pressure is reduced and then restored to normal, thereby causing the infiltration of silver nitrate into the cavities 88. The chips are then heated in air to a temperature between 700° C. and 840° C. to decompose the silver nitrate and produce a deposit of silver in the cavities. Alternatively, the chips may be placed in a batch of molten lead or a lead containing alloy in a vessel wherein the pressure is reduced to evacuate the cavities. The pressure is then raised to force the molten metal into the cavities 88.

Figure 10:
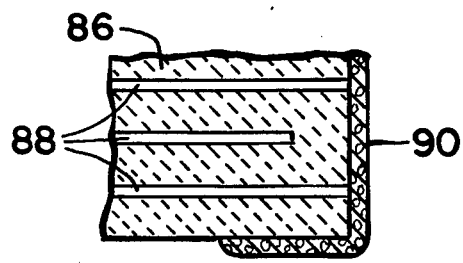
Figure 7:
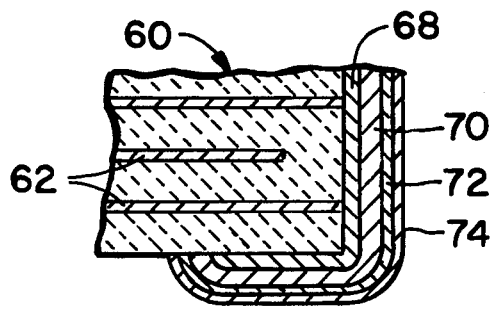
Figure 11:
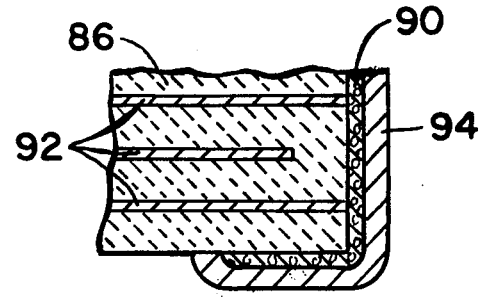

In a preferred embodiment, prior to introducing conductive material into cavities 88, a layer 90 of porous conductive material is applied to each end of the chip to which cavities 88 extend as shown in FIG. 10. Coating 90 must be a conductive material which will adhere to the ceramic chip, be porous to permit impregnation of cavities 88 therethrough, and allow wetting of the impregnation alloy. Coating 90 may be formed of such materials as silver, gold, palladium and mixtures thereof. As taught in the aforementioned U.S. Pat. No. 4,030,004, porous end termination electrodes can be applied to a chip by coating the end faces thereof on which the porous strata are exposed with a commercial palladium-silver electroding paste and firing the coated chip at about 880° C. for about 1 hour. A suitable conductive end termination could also be applied to the aforementioned chip end faces by sputtering a metal thereon.

The chip illustrated in FIG. 10 can then be immersed in a lead alloy as described above. The lead alloy penetrates porous coating 90 and fills the cavities to form conductive electrodes 92. Also, a sufficient amount of lead alloy is allowed to remain on the surface of porous coating 90 to form compliant coating 94. As in the previous embodiment, a layer 96 of a metal such as nickel, nickel alloy or copper is deposited on coating 94, and a layer 98 of a solderable metal such as tin or tin alloy is deposited on the surface of layer 96.

In a modification of the embodiment described in conjunction with FIGS. 8 through 12, molten metal may be introduced into the open structured strata 88 (FIG. 9) without having first applied a porous termination electrode to the end of the body. Such a method of injecting the molten metal electrode material is described in the aforementioned U.S. Pat. No. 3,679,950. After the open structured strata has been provided with conductive electrode material, the end faces of the chip can be provided with conductive end terminations. Since the end terminations must be applied by a technique which would not melt the capacitor electrodes, a technique such as sputtering or applying a conductive epoxy may be employed.

A plurality of monolithic capacitor chips were formed in accordance with the method described in conjunction with FIGS. 8 through 12, said method being of the type disclosed in the aforementioned U.S. Pat. No. 4,030,004. Porous end termination 90 was formed by applying a silver-containing paste to opposite ends of the chips and firing. Electrodes 92 were formed by placing chips of the type illustrated in FIG. 10 into an evacuated chamber and then immersing the chips in a batch of molten lead alloy which was composed of 1.5% silver, 93.5% lead and 5% tin. The pressure was then increased, and the chips were removed from the bath and cooled. The cavities 88 and the pores of the porous silver end terminations 90 were filled with the lead alloy, and a compliant coating of the alloy remained over the entire surface of the porous silver electrodes.

The chips were then placed in a bath of sulfamate where they were electroplated with a thin layer of nickel. Thereafter, they were immersed in a solution of acid tin where the outer surface of the compliant end terminations were plated with tin.

Thirty of the resultant chips were soldered to alumina substrates using hot plate soldering techniques with 62-36-2 solder paste. These substrates were then cycled from −55° to +125° C. for five cycles and were examined under a microscope for physical damage. The substrates were in the testing chambers for 45 minutes at each temperature. This temperature cycling and examining procedure was repeated four times so that each chip was subjected to a total of 20 cycles of the aforementioned temperature extremes.

After completion of the 20 cycles, 11 chips on one substrate were subjected to a push-off test to evaluate bond strength. The lowest push-off strength was 5 pounds and the highest was 11.5 pounds, the average for the 11 chips being 8.5 pounds. None of the 30 chips were damaged in any manner from the temperature cycling.

I claim:

1. A monolithic chip capacitor comprising
a multilayer dielectric capacitor body formed of stacked, alternately arranged layers of dielectric material and metallic electrode material, alternate electrode layers extending to opposite endfaces of the body,
a noncompliant metalized layer on each of said opposite endfaces electrically contacting the electrode layers extending thereto,
a coating of compliant, conductive material on the surface of each of said noncompliant metalized layers, said compliant, conductive material containing tin and silver and having a thickness of at least 2.5 μm, and
a metallic layer disposed over the surface of each of said compliant coatings, the melting point of the metallic layers being greater than that of said compliant coating, said metallic layer having a melting point greater than 900° C.

2. A capacitor in accordance with claim 1 wherein said compliant, conductive material is an alloy comprising at least 50% lead.

3. A capacitor in accordance with claim 1 wherein said metallic layer comprises a relatively easily oxidized metal on the surface of said coating of compliant material, said capacitor further comprising an oxidation resistant metal on the surface of said relatively easily oxidized metal.

4. A capacitor in accordance with claim 3 wherein said relatively easily oxidized metal is selected from the group consisting of copper and nickel.

5. A capacitor in accordance with claim 4 wherein said oxidation resistant metal is selected from the group consisting of tin, gold, silver, platinum and alloys thereof.

6. A capacitor in accordance with claim 5 wherein said compliant, conductive material comprises at least 90% lead.

7. A monolithic chip capacitor which is adapted to be connected directly to conductive lands of a circuit board without the use of lead wires, said capacitor comprising
a multilayer dielectric capacitor body formed of stacked, alternately arranged layers of dielectric material and metallic electrode material, alternate electrode layers extending to opposite endfaces of the body,
a noncompliant metalized layer on each of said opposite endfaces electrically contacting the electrode layers extending thereto,
a coating of compliant, conductive material over the entire surface of each of said noncompliant metalized layers, and
a metallic layer disposed over the entire surface of each of said compliant coatings, the melting point of the metallic layers being greater than that of said compliant coating.

8. A capacitor in accordance with claim 7 wherein said compliant, conductive material is an alloy comprising at least 90% lead.

9. A capacitor in accordance with claim 8 wherein said compliant, conductive material contains tin and silver.

* * * * *